(12) United States Patent
Kojima et al.

(10) Patent No.: US 6,525,975 B2
(45) Date of Patent: Feb. 25, 2003

(54) SEMICONDUCTOR INTEGRATED CIRCUIT DEVICE AND DATA-WRITE METHOD THEREOF

(75) Inventors: Kazumi Kojima, Kasugai (JP); Yasushige Ogawa, Kasugai (JP); Hiroyuki Sugamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/947,459

(22) Filed: Sep. 7, 2001

(65) Prior Publication Data
US 2002/0145927 A1 Oct. 10, 2002

(30) Foreign Application Priority Data
Apr. 10, 2001 (JP) ........................................ 2001-111604

(51) Int. Cl.[7] ................................................. G11C 7/00
(52) U.S. Cl. .................... 365/205; 365/207; 365/189.01
(58) Field of Search ................................. 365/205, 207, 365/189.01, 149

(56) References Cited

U.S. PATENT DOCUMENTS 5,289,431 A * 2/1994 Konishi .................. 365/230.03
5,555,210 A * 9/1996 Kato .......................... 365/105
5,923,592 A * 7/1999 Morgan et al. ......... 365/189.01
6,345,006 B1 * 2/2002 Ingalls et al. ............... 365/205

* cited by examiner

Primary Examiner—Huan Hoang
(74) Attorney, Agent, or Firm—Arent Fox Kintner Plotkin & Kahn, PLLC (57) ABSTRACT

There is intended to provide a semiconductor integrated circuit device capable of lowering the power consumption during data-write operation, enhancing operation speed, and reducing noises for stable operation. In the semiconductor integrated circuit, an active signal ACT to be inputted to a sense amplifier signal circuit SC1 is latched by a command latch circuit and outputted to a terminal N11. The terminal N11 outputs a control signal EDC1 via a timing adjusting circuit. The control signal EDC1 works to output a sense amplifier activating signal LE via a timing adjusting circuit and output buffer circuit and at the same time, the control signal EDC1 is outputted to a column switch signal circuit CS1. From the Column switch signal circuit CS1, a pulse signal is outputted via input of a control signal ACL, a pulse output circuit, and a terminal N13. In a logical circuit, AND processing is conducted between the pulse signal and an inversion signal of the control signal EDC1. Through a decode circuit, a resultant signal is outputted as switch signal CL, or CLM.

14 Claims, 11 Drawing Sheets

FIG. 1 DIAGRAM TO DESCRIBE PRINCIPLE OF THE PRESENT INVENTION

FIG. 2  CIRCUIT BLOCK DIAGRAM SHOWING A MEMORY CELL SECTION DIRECTED TO A FIRST EMBODIMENT

FIG. 3
CIRCUIT DIAGRAM SHOWING THE MAIN PART OF THE FIRST EMBODIMENT

FIG. 4 OPERATIONAL WAVEFORM DIAGRAM THE MAIN PART OF THE FIRST EMBODIMENT

FIG. 5  CIRCUIT BLOCK DIAGRAM SHOWING A MEMORY CELL SECTION DIRECTED TO A SECOND EMBODIMENT

FIG. 6 CIRCUIT DIAGRAM SHOWING THE MAIN PART OF THE SECOND EMBODIMENT

FIG. 7
WAVEFORM DIAGRAM SHOWING OPERATION OF THE MAIN PART OF THE SECOND EMBODIMENT

FIG. 8

WAVEFORM DIAGRAM SHOWING DATA-WRITE OPERATION ONTO THE MEMORY CELL SECTION OF THE FIRST AND SECOND EMBODIMENTS

FIG. 9 PRIOR ART
CIRCUIT BLOCK DIAGRAM OF PRIOR ART

FIG. 10 PRIOR ART

WAVEFORM DIAGRAM SHOWING DATA-READOUT OPERATION
FROM MEMORY CELL SECTION OF PRIOR ART

FIG. 11    PRIOR ART

WAVEFORM DIAGRAM SHOWING DATA-WRITE OPERATION
ONTO MEMORY CELL SECTION OF PRIOR ART

SEMICONDUCTOR INTEGRATED CIRCUIT DEVICE AND DATA-WRITE METHOD THEREOF

BACKGROUND OF THE INVENTION

1. Field of the Invention

The present invention relates to technique of data-write on memory cells for a semiconductor integrated circuit. More particularly, it relates to enhancement of low power consumption, or high-speed operation, and stable operation during data-write operation.

2. Description of Related Art

With the recent progress of computer technology, there has been needed a memory usable for graphic processing purpose such as three dimensional animation pictures wherein address cycle changes irregularly. In other words, high-speed random access performance is required for a memory regardless of data-readout cycle and data-write cycle. However, this kind of high-speed random access performance is not feasible for synchronous type semiconductor memory devices such as dynamic random access memory (referred to as DRAM hereinafter) and synchronous type DRAM (SDRAM, hereinafter) that multiplex row address and column address and input the addresses with different timing.

As a high-speed memory that can realize high-speed cycle time performance of static random access memory (SRAM, hereinafter) while making the most use of high circuit integration design of DRAM and SDRAM, there has been devised a memory that inputs data without multiplexing addresses and determines whether readout cycle or write cycle within a command. Fast Cycle RAM, or FCRAM (Registered Trademark), is a noticeable example of that.

Figure 9:
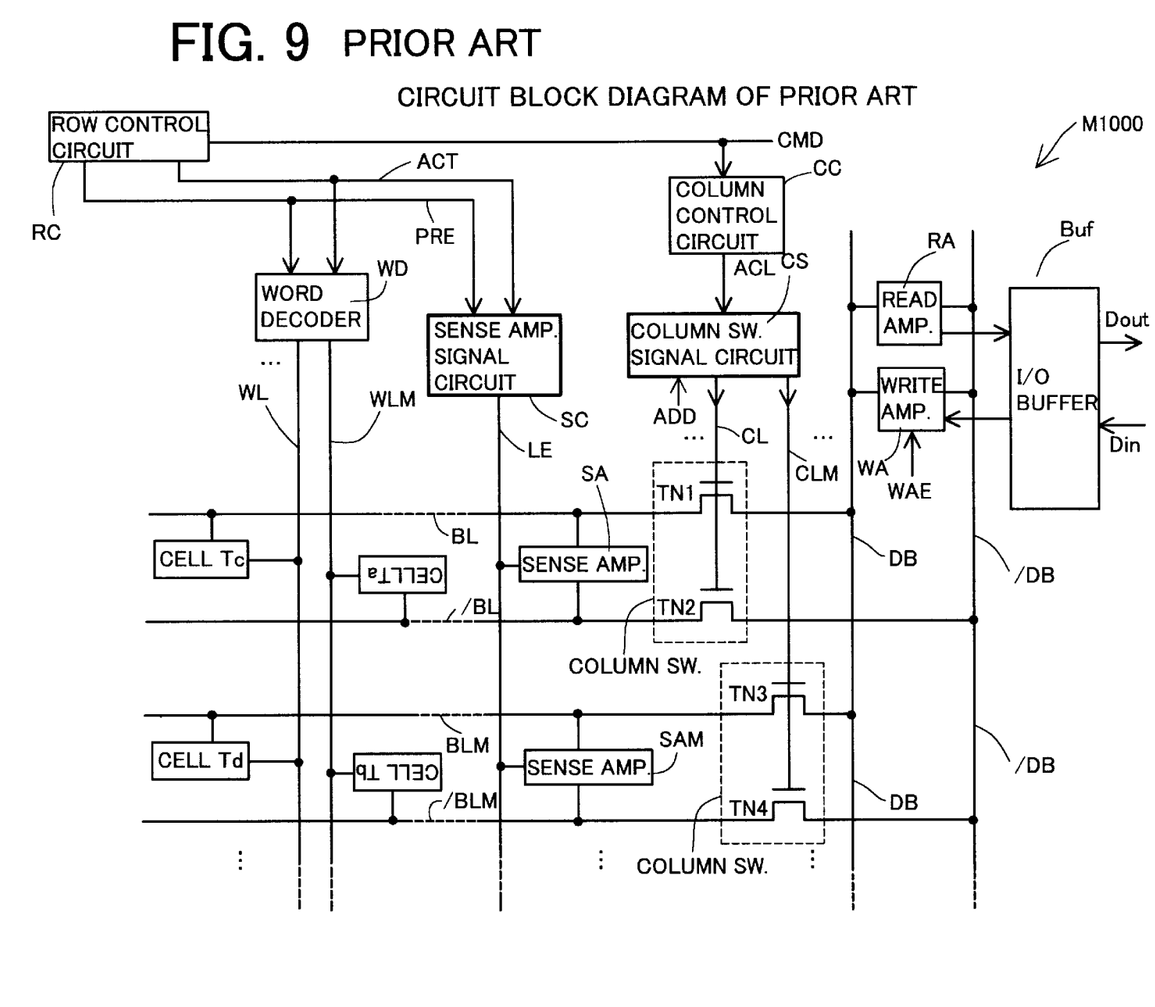
FIG. 9 is a circuit block diagram of prior art.

A memory cell section M1000 in FIG. 9 shows the structure of a high-speed memory. For concise description, FIG. 9 shows a part of the memory, or indispensable structural elements thereof. Memory cells Ta, Tb, Tc, and Td are connected to bit lines /BL, /BLM, BL, BLM, respectively. Data stored in the memory cells Ta, Tb, Tc, and Td are readout as stored charges. After redistributed to the respective bit lines BL, /BL, BLM, /BLM, the stored charges are amplified by sense amplifiers SA, and SAM with being coupled as bit line pair BL, /BL and bit line pair BLM, /BLM. The amplified data are delivered to data bus lines DB, and /DB through column switches TN1, TN2, TN3, and TN4, and then, amplified by a read amplifier RA and outputted from an input/output buffer Buf (from Dout). On the contrary, input data Din are amplified by a write amplifier WA through the input/output buffer Buf, and then, stored in memory cells Ta, Tb, Tc, and Td as charges through bit lines BL, /BL and BLM, /BLM from the data bus lines DB, and /DB.

Out of the memory cells Ta, Tb, Tc and Td, selection of memory cells to be connected the bit line pairs BL, /BL and BLM, /BLM is made by an active signal ACT and a precharge signal PRE transmitted from a row control circuit RC that has received a command signal CMD. More specifically, the active signal ACT and the precharge signal PRE make a word decoder WD active/inactive so as to make signal level of word lines WL and WLM high level. Furthermore, a sense amplifier signal circuit SC controls activation signal LE for the sense amplifiers SA and SAM based on the active signal ACT and the precharge signal PRE. Thereby, the sense amplifiers SA and SAM are made active/inactive. Still further, a column control circuit CC outputs a control signal ACL based on a command signal CMD from the row control circuit RC. Then, a column switch signal circuit Cs controls switch signals CL, and CLM, whereby column switches TN1, TN2, TN3 and TN4 are made conductive/nonconductive.

Figure 10:
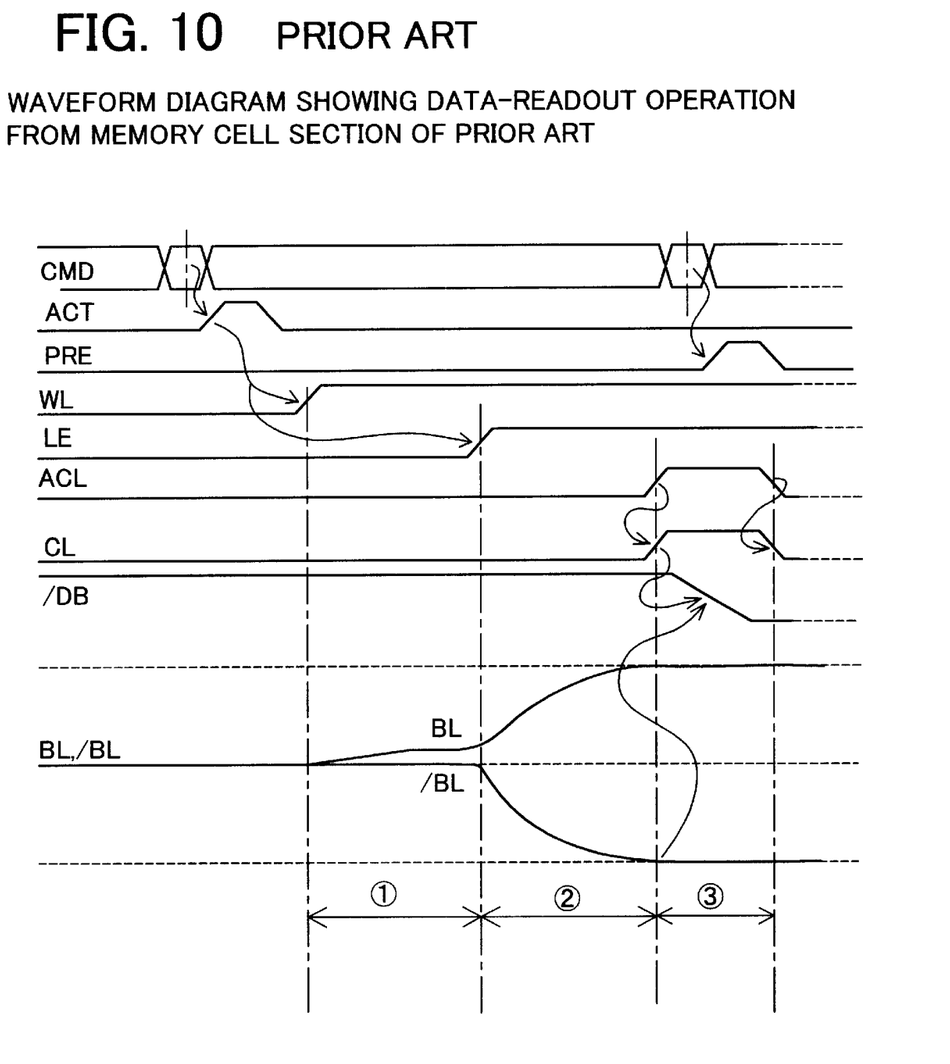
FIG. 10 is a waveform diagram showing data-readout operation from memory cell section of prior art.
Figure 11:
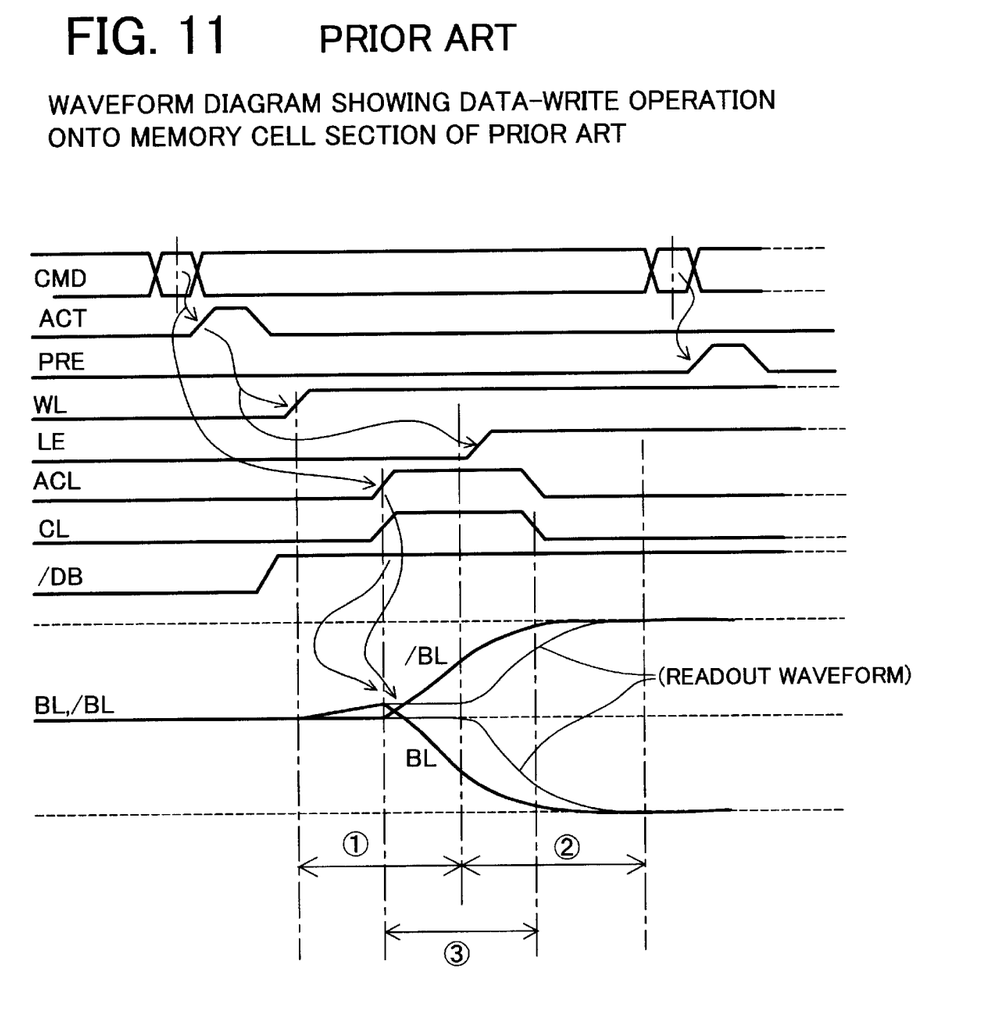
FIG. 11 is a waveform diagram showing data-write operation onto memory cell section of prior art.

FIG. 10 shows a waveform diagram of readout operation and FIG. 11 shows that of write operation. A command signal CMD activates the row control circuit RC to output an active signal ACT. Owing to the active signal ACT, the word line WL from the word decoder WD is selected. Then, the memory cells Tc and Td are connected to the bit lines BL and BLM, respectively, and stored charges are redistributed to the bit lines BL and BLM. Up to this point, readout operation and write operation are in the same manner.

Firstly, readout operation will be described. Due to redistribution of stored charges, the bit lines BL and /BL both in equalized state begin to have potential differences gradually (this period is named Period $\hat{1}$. As to the bit lines BLM, and /BLM, operation is taken in the same manner as the bit lines BL, and /BL. Accordingly, the following explanation will be omitted. The Period $\hat{1}$ means a period until the potential difference between the bit lines BL and/BL reaches amplification sensitivity of the sense amplifier SA. The potential difference at this point is of about several ten mV. After the Period $\hat{1}$ terminates, an activation signal LE for the sense amplifier SA is set to high level. Thereby, the sense amplifier SA is driven to amplify the bit lines BL and /BL (this period is named Period $\hat{2}$. After the bit lines BL and /BL are amplified, the control signal ACL is set to high level so as to start up a switch signal CL with high level and readout data on the data bus lines DB and /DB (this period is named Period $\hat{3}$. Time that the switch signal CL is kept high level is optimized as the time needed to readout data from the bit lines BL and /BL to the data bus lines DB and /DB. It is the column control circuit CC that sets optimum time.

Next, write operation will be described. When the Period $\hat{1}$ begins and the memory cell Tc is selected on condition that the memory cells Ta and Tc are connected to the bit lines BL and /BL, respectively, a switch signal CL is set to high level. Thereby, the data bus lines DB and /DB are connected to the bit lines BL and /BL, respectively. Then, the write amplifier WA begins write operation. Since this write operation is made with the switch signal CL being set, this period corresponds to the Period $\hat{3}$ mentioned in the readout operation. Prompt write operation is required because some data must be inversed to obtain write data and also because the potential difference between the bit lines BL and/BL must reach amplification sensitivity of the sense amplifier SA before the Period $\hat{2}$ begins. Load that the write amplifier WA must drive is significantly large. That is, the write amplifier WA must drive load for both the data bus lines DB, /DB and the bit lines BL, /BL. Driving ability of the write amplifier WA must be designed high enough to quickly finish data-write on the bit lines BL and /BL before the Period $\hat{2}$ begins. Since setting time of the switch signal CL (Period $\hat{3}$ is set by the column control circuit CC and length of the setting time is fixed, the Period $\hat{2}$ sometimes begins before the Period $\hat{3}$ terminates.

During write operation, the bit lines BLM and /BLM not subject to data-write exercises the above-mentioned readout operation.

During write cycle, the write amplifier WA needs to write data on the bit lines BL, /BL via the data bus lines DB, /DB, respectively, within a period to readout charges stored in cells (corresponding to the Period $\hat{1}$ in FIG. 11). That is, within such a short time as the Period $\hat{1}$, the write amplifier WA must drive the data bus lines DB, /DB and data bit lines BL, /BL up to a predetermined voltage. Accordingly, driving ability of the write amplifier WA must be designed sufficiently high. Owing to this, an area occupied by the write amplifier WA becomes large on a chip and along with that, power consumption becomes high. This can be an obstacle to trend of semiconductor integrated circuit device design such as higher circuit integration and lower power consumption.

Moreover, data written on the bit lines BL, /BL are amplified up to full amplitude by the sense amplifier SA during amplification period for the bit lines (corresponding to the Period $\hat{2}$. In the read operation, it is necessary to surely obtain a readout period (corresponding to the Period $\hat{1}$. That is, the bit lines BL, /BL are connected to the data bus lines DB, /DB, respectively, and after the data written on the bit lines are amplified, amplified voltage needs time to be readout on the data bus lines DB, /DB. The column control circuit CC sets the readout period. In the write cycle, the Period $\hat{3}$ begins to exercise write operation during the Period $\hat{1}$. Since the column control circuit CC sets length of the Period $\hat{3}$ fixedly, the latter half of the Period $\hat{3}$ and the first half of the Period $\hat{2}$ sometimes overlap each other in the write cycle. Therefore, the sense amplifier SA must drive loads for not only the bit lines BL, /BL but also the data bus lines DB, /DB. Thus, the amount of loads is large for the sense amplifier SA. Due to restriction of access time, the sense amplifier SA must amplify data on the bit lines BL, /BL within a predetermined time. Therefore, in the event that an amount of loads becomes large, potential difference larger than in the readout time must be written on the bit lines BL, /BL during the Period $\hat{3}$ within the Period $\hat{1}$. On the other hand, in the Period $\hat{1}$, charges stored in memory cells are redistributed to the bit lines BL, /BL and the sense amplifier SA has not been activated yet at this point. Therefore, potential difference between the bit lines BLM, /BLM is subtle (of about several ten mv) and it is in floating state. Accordingly, sudden potential change may occur to the bit lines BL, /BL which are subject to data-write. As a result, voltage change occurs to the bit lines BLM, /BLM influenced by capacity coupling between adjacent pairs of bit lines /BL and BLM, for example. Moreover, the potential difference between the bit lines BLM and /BLM is subtle. As a result, potential relation between the bit lines BLM and /BLM is inverted due to noise caused by the capacity coupling.

As higher circuit integration and higher speed operation are demanded for a semiconductor integrated circuit device, increase of an area that a write amplifier WA should occupy on a chip so as to secure driving ability and influence of noise onto the bit lines BLM, /BLM become more problematic. Furthermore, the increase of driving ability for a write amplifier WA is an obstacle to lower power consumption demanded along with higher circuit integration design.

SUMMARY OF THE INVENTION

The present invention is intended to solve the foregoing prior art deficiency. Its prime object is to provide a semiconductor integrated circuit device capable of fully achieving low power consumption and high-speed operation during data-write time, and stable operation with less occurrence of noises due to write operation. More specifically, in the inventive semiconductor integrated circuit device, data-write operation on memory cells is exercised after taking the following two steps: (1) input voltage that can be amplified on bit lines; and (2) amplify bit line voltage by blocking data input paths toward the bit lines.

In order to achieve the above objective, the semiconductor integrated circuit device based on one aspect of this invention has memory cells and bit lines which are connected to the memory cells and exercise readout/write of data between the memory cells and the bit lines, wherein the device further includes: a write amplifier for inputting the data on the bit lines so as to write the data on the memory cells; a switching section for connecting the write amplifier and the bit lines; a sense amplifier for amplifying voltage inputted on the bit lines; and the sense amplifier is activated on condition that the write amplifier inputs the data on the bit lines to make the switching section nonconductive.

In the inventive semiconductor integrated circuit device, for data-write on the memory cells, the write amplifier firstly inputs data into the bit lines through the switching section and then, the sense amplifier activates and amplifies data voltage inputted in the bit lines with the switching section nonconductive.

Figure 1:
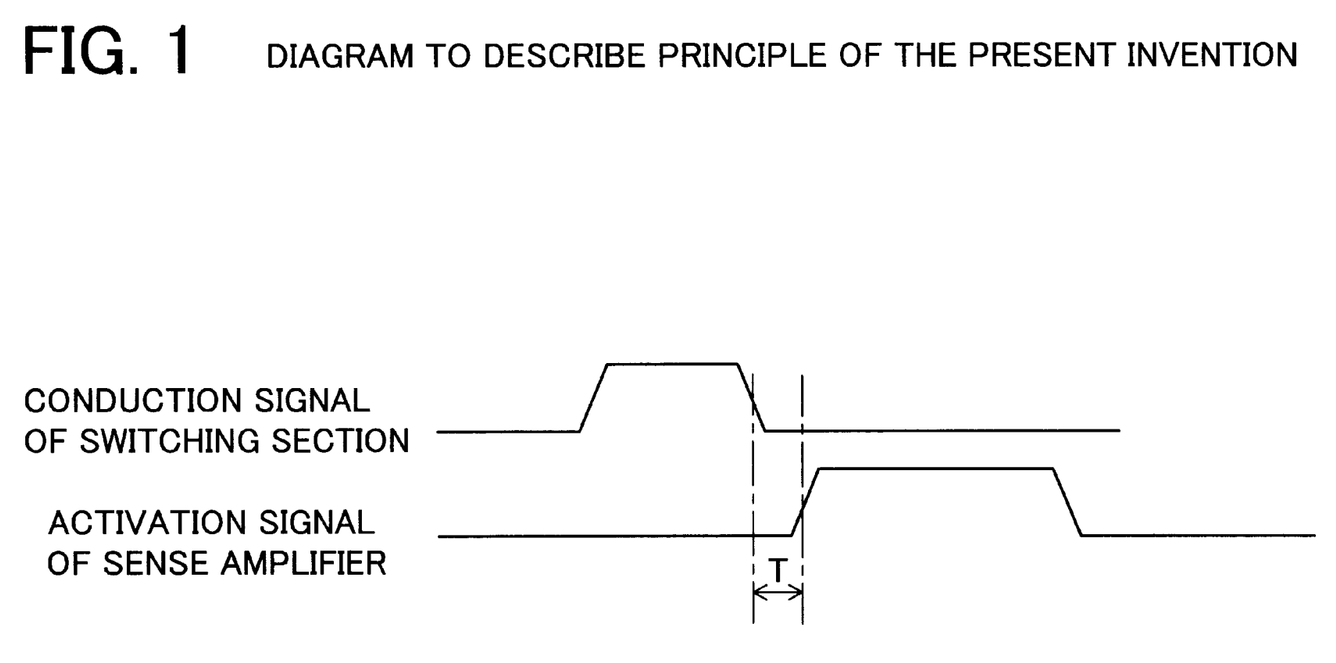
FIG. 1 is a diagram to describe principle of the present invention.

FIG. 1 shows the principle of the present invention. A conduction signal for the switching section and an activation signal for the sense amplifier are signals to make logical high-level active state. The conduction signal for the switching section makes the switching section active only while in a high-level period. The activation signal for the sense amplifier makes the sense amplifier active only while in a high-level period. For switching hi-level periods, or switching active periods of the two signals, a time difference T is taken. Accordingly, it never occurs that the sense amplifier becomes active with the switching section remaining conductive. There is structured an operation sequence wherein the sense amplifier becomes active after the switching section becomes nonconductive.

A data-write method of semiconductor integrated circuit device based on the one aspect of this invention comprises: data input process to input the data to be written on the memory cells to the bit lines; separation process to separate the bit lines from input route of the data after the data is inputted to the bit lines; and amplification process to amplify voltage of the data on the bit lines separated from the input route.

Thereby, data inputted in the bit lines through the switching section made conductive by the write amplifier are amplified by the sense amplifier after the switch section is made nonconductive. The data are amplified up to voltage value to be written in the memory cells. That is, data write operation can be conducted by taking the following two-step operation: (1) the write amplifier inputs bit line voltage up to voltage value to be able to amplify the sense amplifier; and (2) after the bit line voltage is inputted, the sense amplifier for amplifying bit line voltage conducts normal data readout operation. Accordingly, voltage value to be inputted by the write amplifier is limited and driving ability of the write amplifier is reduced to a minimum essential. As a result, circuit scale of the write amplifier is made small, its occupation rate on a chip can be made small, and power consumption can be lowered. This contributes to higher circuit integration design of semiconductor integrated circuit device and lower power consumption. In this case, the minimum value of the bit line voltage to be inputted by the write amplifier corresponds to voltage of the sense amplifier at it samplification sensitivity. If this voltage value is set as a minimum essential voltage, driving ability of the write amplifier can be set to a minimum essential. When the write amplifier inputs voltage higher than the minimum essential, the sense amplifier can surely amplify the bit line voltage and write data on the memory cells.

The above and further objects and novel features of the invention will more fully appear from following detailed description when the same is read in connection with the accompanying drawings. It is to be expressly understood, however, that the drawings are purpose of illustration only and not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings.

DETAILED DESCRIPTION OF THE PREFERRED EMBODIMENTS

Preferred embodiments of the semiconductor integrated circuit device based on this invention will be explained in detail with reference to FIG. 2 through FIG. 8.

Figure 2:
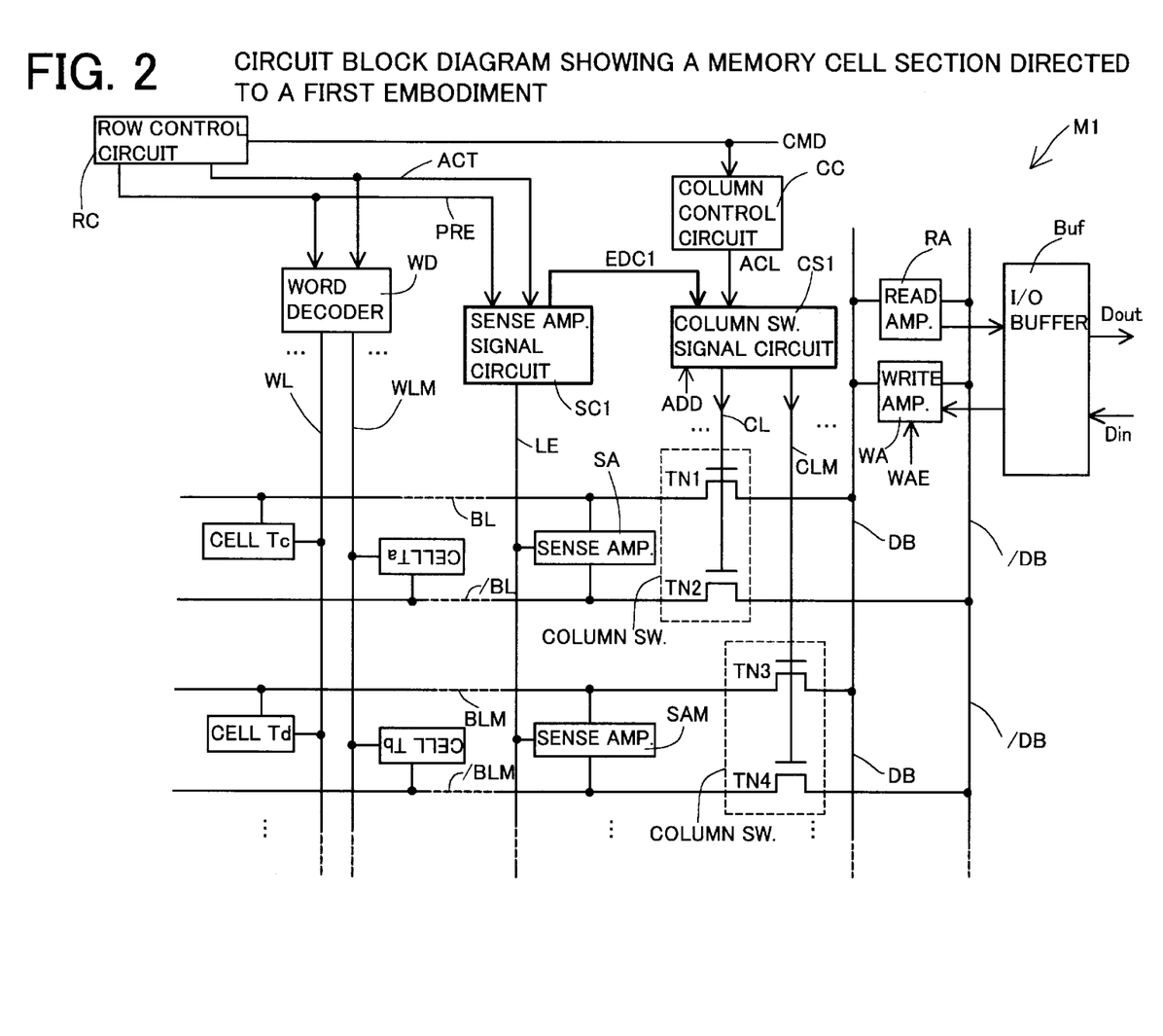
FIG. 2 is a circuit block diagram showing a memory cell section directed to a First Embodiment.

A memory cell section M1 directed to a First Embodiment as shown in FIG. 2 has a sense amplifier signal circuit SC1 and a column switch signal circuit CS1, instead of the sense amplifier signal circuit SC and the column switch signal circuit CS directed to the memory cell section M1000, prior art, as shown in FIG. 9. The column switch signal circuit CS1 is controlled by a control signal EDC1 transmitted from the sense amplifier SC. The control signal EDC1 is anon-conductivation command signal which controls switch signals CL and CLM to make column switches TN1, TN2, TN3 and TN4 nonconductive.

Figure 3:
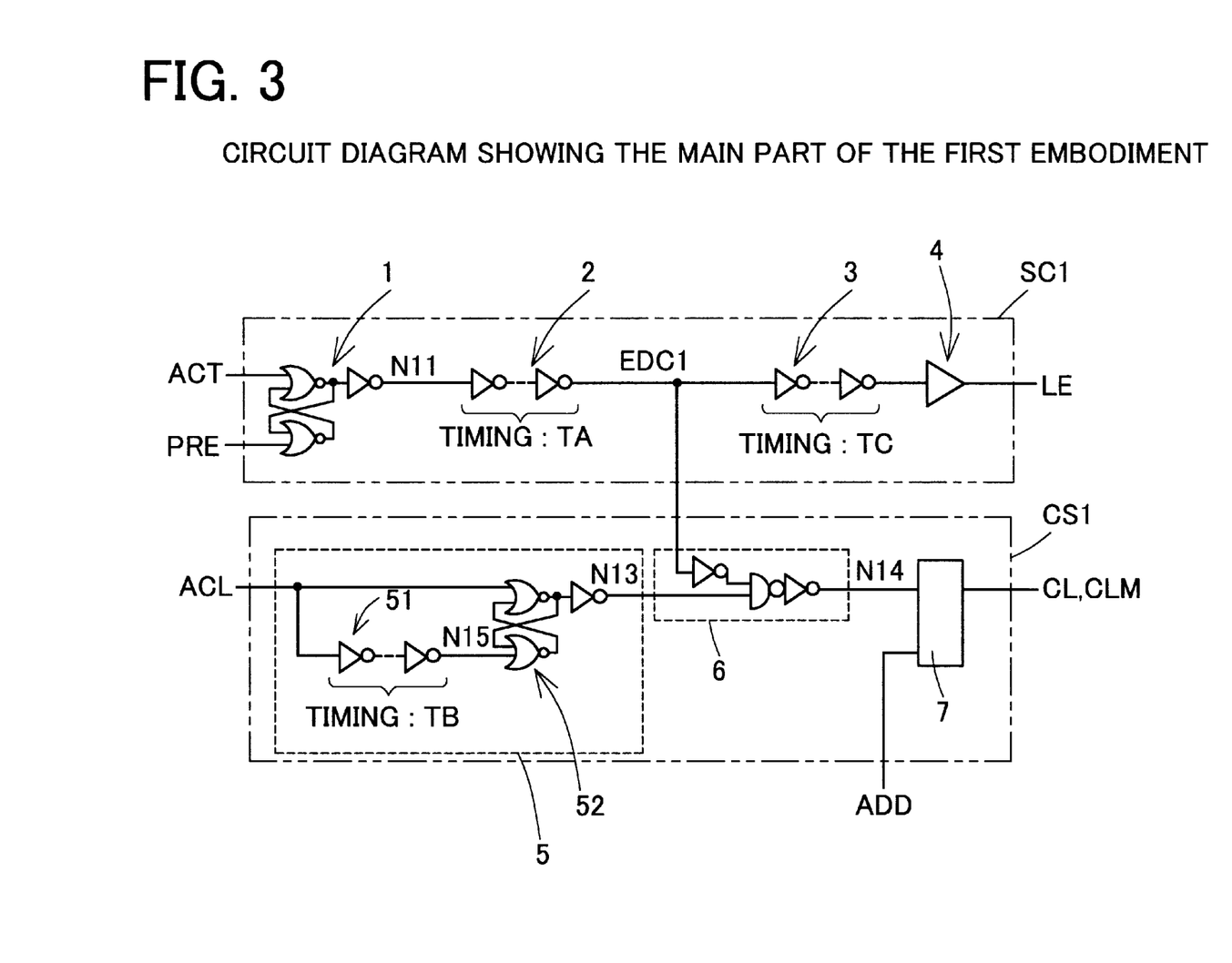
FIG. 3 is a circuit diagram showing the main part of the First Embodiment.

The circuit diagram directed to the First Embodiment shown in FIG. 3 is a typical internal circuit composed of the sense amplifier signal circuit SC1 and the column switch signal circuit CS1.

An active signal ACT and a precharge signal PRE both of which are outputted from a row control circuit RC in accordance with a command signal CMD are inputted onto the sense amplifier signal circuit SC1. The active signal ACT and the precharge signal PRE are inputted onto a command latch circuit 1. The command latch circuit 1 comprises a latch circuit wherein there are composed of two NOR gates both having two input terminals and each of the output signals is fed back into the other's input terminal. An output signal from the command latch circuit 1 is outputted to a terminal N11 with being inverted by an inverter gate through a NOR gate to which the active signal ACT inputted. The terminal N11 outputs a control signal EDC1 via a timing adjusting circuit 2 composed of a predetermined even-numbered stages of inverter column. The control signal EDC1 outputs a sense amplifier activating signal LE via the timing adjusting circuit 3 and an output buffer circuit 4. Furthermore, the control signal ECD1 is outputted to the column switch signal circuit CS1.

In the sense amplifier signal circuit SC1, an active signal ACT in positive logic is inputted into the command latch circuit 1 to set the terminal N11 high level. Thereby, the sense amplifier SA is activated. An activation signal LE for the sense amplifier SA is outputted after a sum of timing TA+TC, beginning with an input of the active signal ACT, lapses. The timing TA is a timing that the timing. adjusting circuit 2 adjusts output timing of the inputted signal. The timing TC is timing that the timing adjusting circuit 3 adjusts the same thing as the above. Non-conductivation timing of the sense amplifier SA is taken after a lapse of the timing TA+TC that begins with an input of the precharge signal PRE in positive logic.

The column switch signal circuit CS1 receives a control signal ACL as an input signal outputted from the column control circuit CC in accordance with a command signal CMD. The input signal ACL is inputted into a pulse output circuit 5. Similar to the command latch circuit 1, the pulse output circuit 5 comprises a latch circuit composed of NOR gates, a command latch circuit 52 having inverter gate, and a timing adjusting circuit 51. The timing adjusting circuit 51 generates a delay signal for the timing TB from a control signal ACL. The delay signal and the control signal ACL are inputted into the command latch circuit 52. A logical circuit 6 outputs an AND signal between a signal from 1, an output terminal N13 of the pulse output circuit 5 and an inversion signal of a control signal EDC 1 to an output terminal N14. Coming out from the output terminal N14, this AND signal is inputted to a decode circuit 7. Then, the decode circuit 7 outputs switch signals CL, CLM to select one of the memory cells Ta through Td decoded by an address signal.

When a control signal ACL as a positive pulse signal is inputted to the column switch signal circuit CS1, a resultant signal having pulse width of the timing TB set in the timing adjusting circuit 51 is outputted toward the terminal N15 from the pulse output circuit 5. In case pulse width of the control signal ACL is narrower than that of the timing TB, the pulse width of the pulse signal outputted toward the terminal N13 corresponds to that of the timing TB, and in case wider than that of the timing TB, the pulse width of the pulse signal outputted toward the terminal N13 corresponds to that of the control signal ACL. When a control signal EDC1 has not been outputted (low level), the positive pulse signal outputted to the terminal N13 is transmitted to the terminal N14 as it is and switch signal CL or CLM corresponding to a predetermined address is outputted via the decode circuit 7 as a resultant signal.

Figure 4:
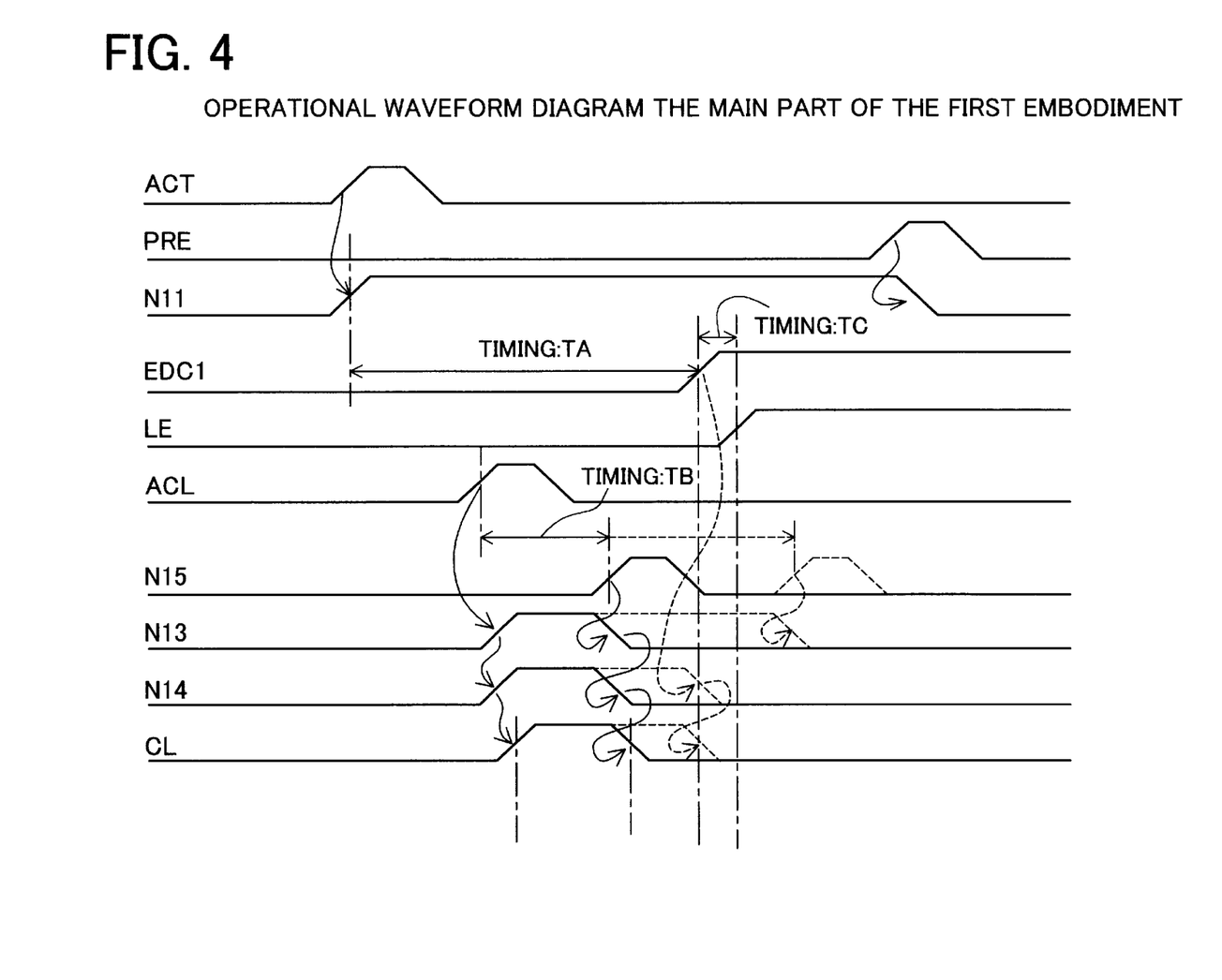
FIG. 4 is an operational waveform diagram of the main part of the First Embodiment.

FIG. 4 shows an operational waveform diagram of the main part of the First Embodiment composed of the sense amplifier signal circuit SC1 and the column switch signal circuit CS1. When a write signal is inputted as a command signal CMD, an active signal ACT transmitted from the row control circuit RC is outputted as a positive pulse signal and inputted to the sense amplifier signal circuit SC1. The command latch circuit 1 latches the signal ACT to set the output terminal N11 high level. After timing TA passes, the signal outputted to the output terminal N11 turns into a control signal EDC1 in high level through the timing adjusting circuit 2. Furthermore, after the control signal EDC1 enters and timing TC set at the timing adjusting circuit 3 lapses, a sense amplifier activation signal LE is outputted through the output buffer circuit 4.

The command signal CMD is inputted to the column control circuit CC as well as the row control circuit RC simultaneously. Posterior to output of an active signal ACT, a control signal ACL is outputted from the column control circuit CC as a positive pulse signal. The control signal ACL is inputted to the pulse output circuit 5 integrated in the column switch signal circuit CS1. Going into the pulse output circuit 5, the control signal ACL sets the command latch signal circuit 52 and is inputted to the timing adjusting circuit 51. As a result, a pulse signal with a delay time corresponding to timing TB is generated at the terminal N15. The delay pulse signal outputted from the terminal N15 resets the command latch circuit 52 and a positive pulse signal is outputted to the terminal N13. Pulse width of the pulse signal corresponds to the timing TB set at the timing adjusting circuit 51. The pulse signal outputted to the terminal N13 is inputted to the logical circuit 6 to obtain AND between the pulse signal and an inversion signal of the control signal EDC1. That is, if the control signal ACL following the active signal ACT outputs the pulse signal with pulse width of the timing TB in high level to the terminal N13 within a timing TA (from input of the active signal ACT until output of the control signal EDC1), a pulse signal the same as at the terminal N13 is obtained at the output terminal N14 of the logical circuit 6. That is, the control signal EDC1 must keep low level because a high level signal from the terminal N11 is not transmitted while a pulse signal is outputted to the terminal N13. The pulse signals at the terminal N14 are outputted as switch signals CL and CLM via the decoder circuit 7. The pulse signals CL and CLM make the column switches TN1 through TN4 conductive. Thereby, the data bus lines DB and /DB are connected to the bit lines BL, /BL, BLM, and /BLM and write-data from the write amplifier WA are inputted to the bit lines BL, /BL, BLM, and /BLM.

If length of the timing TB of the timing adjusting circuit 51 is set longer, the pulse width at the terminal N13 becomes longer in response to it. If termination timing of the pulse signal at the terminal N13 is within the timing TA, namely, from input of the active signal ACT until output of the control signal EDC1, pulse width of the switch signal CL, and CLM at the terminal N14 can be set longer in proportion to extension rate of the pulse signal at the terminal N13. In this case, the column switches TN1 through TN4 are made conductive and for even longer time whereby the data bus lines DB and /DB are connected to the bit lines BL, /BL, BLM, and /BLM and write-data from the write amplifier WA can be inputted to the bit lines BL, /BL, BLM, and /BLM, The longer the timing TB is set, the longer the pulse width at the terminal N13 is. As a result, the control signal EDC1 is high level when the timing TA (beginning with input of the active signal ACT) terminates. Thereby, the signal at the output terminal N14 within the logical circuit 6 is fixed in low level. Therefore, the resultant pulse signal at the terminal N 14 is restricted with the timing TA beginning with input of the active signal ACT. In this case, the activation signal LE from the sense amplifier SA is outputted after the timing TC (beginning with termination of the switch signals CL, CLM) passes. That is, the activation signal LE of the sense amplifier SA starts up allowing a margin after lapse of a period from termination of the switch signals CL, CLM until lapse of the timing TC. Regardless of length of the timing TB, the activation signal LE of the sense amplifier SA starts up taking a timing TA+TC which begins with input of the active signal ACT.

Although it is not shown in FIG. 4, even in case that output of a control signal ACL against an active signal ACT is delayed and case that output timing TA of an activation signal LE for the sense amplifier SA is shortened, a timing TC is surely obtained between falling of the switch signals CL and CLM and rising of an activation signal LE for the sense amplifier SA.

Other than the above settings, optimum operation can be set by appropriately adjusting length of timing TA, TC, and TB directed to the timing adjusting circuits 2, 3 and 51, respectively.

According to the First Embodiment, a time difference longer than the timing TC is surely obtained between non-conductivation operation of the column switches TN1 through TN4 and activation of the sense amplifier SA. Thereby, the sense amplifier SA can be made activated after the column switches TN1 through TN4 are made nonconductive.

Furthermore, pulse width of the switch signals CL, CLM can be adjusted to the timing TB so that voltage to write data on the bit lines BL, /BL, BLM, and /BLM should be minimum voltage needed for amplification of the sense amplifier SA. As a result, amount of task such as data input operation done by the write amplifier WA for the bit lines BL, /BL, BLM, and /BLM can be limited to a minimum essential. Thereby, driving ability of the write amplifier WA can be lessened to a minimum essential, as well. Such aspects as the above contribute to development of higher circuit integration and lower power consumption for semiconductor integrated circuit device.

Still further, output timing of the activation signal LE for the sense amplifier SA is fixed within the timing TA+TC which begins with input of the active signal ACT. Accordingly, once this timing is optimized as a readout time, writing operation can be inserted in readout operation.

Figure 5:
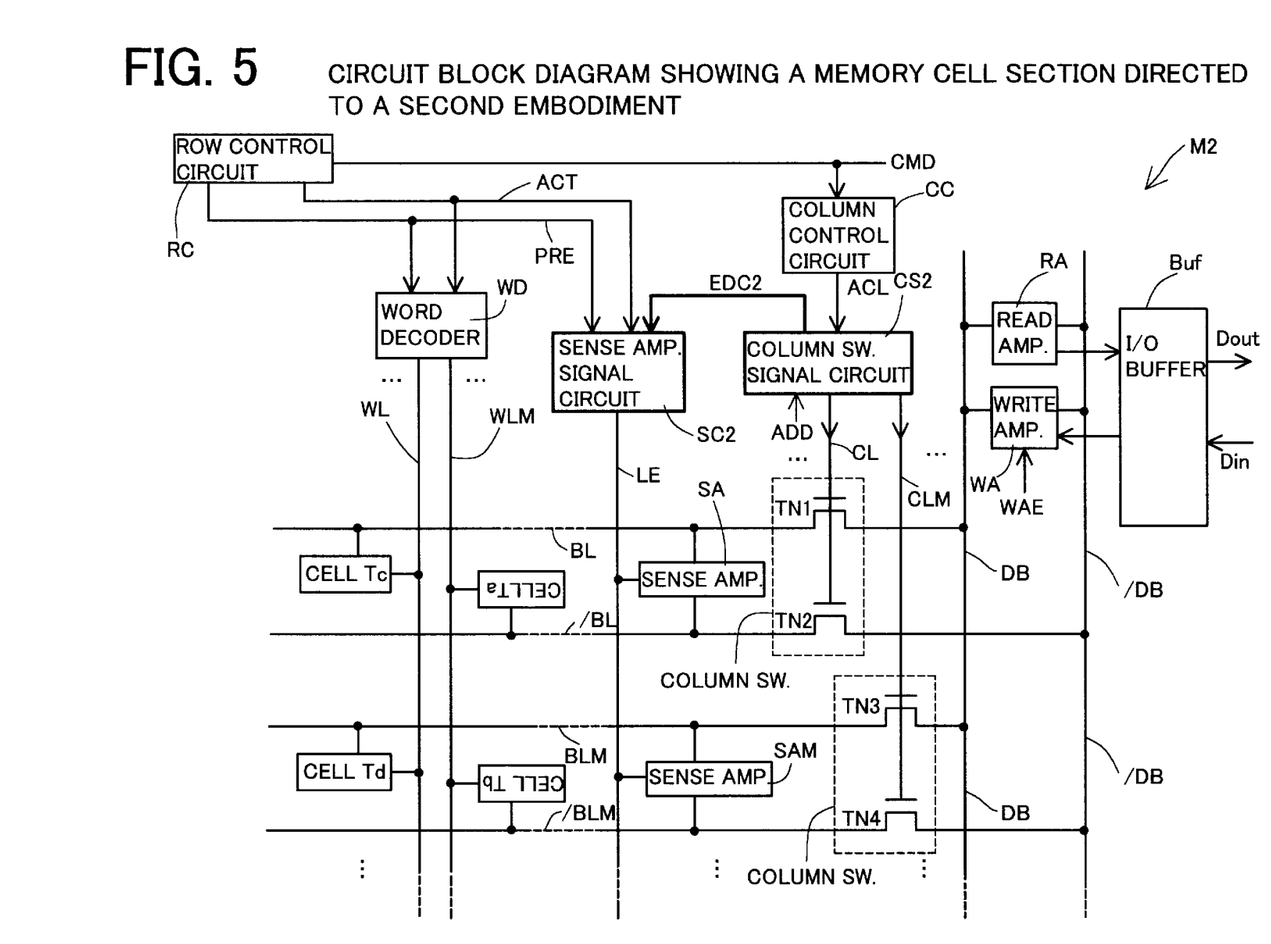
FIG. 5 is a circuit block diagram showing a memory cell section directed to a Second Embodiment.

A memory cell section M2 directed to a Second Embodiment as shown in FIG. 5 has a sense amplifier signal circuit SC2 and a column switch signal circuit CS2, instead of the sense amplifier signal circuit SC and the column switch signal circuit CS directed to the memory cell section M1000, prior art, as shown in FIG. 9. Contrary to the First Embodiment, in the Second Embodiment, the sense amplifier signal circuit SC2 is controlled by a control signal EDC2 transmitted from the column switch signal circuit CS2. The control signal EDC2 is an activation command signal which controls a sense amplifier activation signal LE to make sense amplifiers SA and SAM active.

Figure 6:
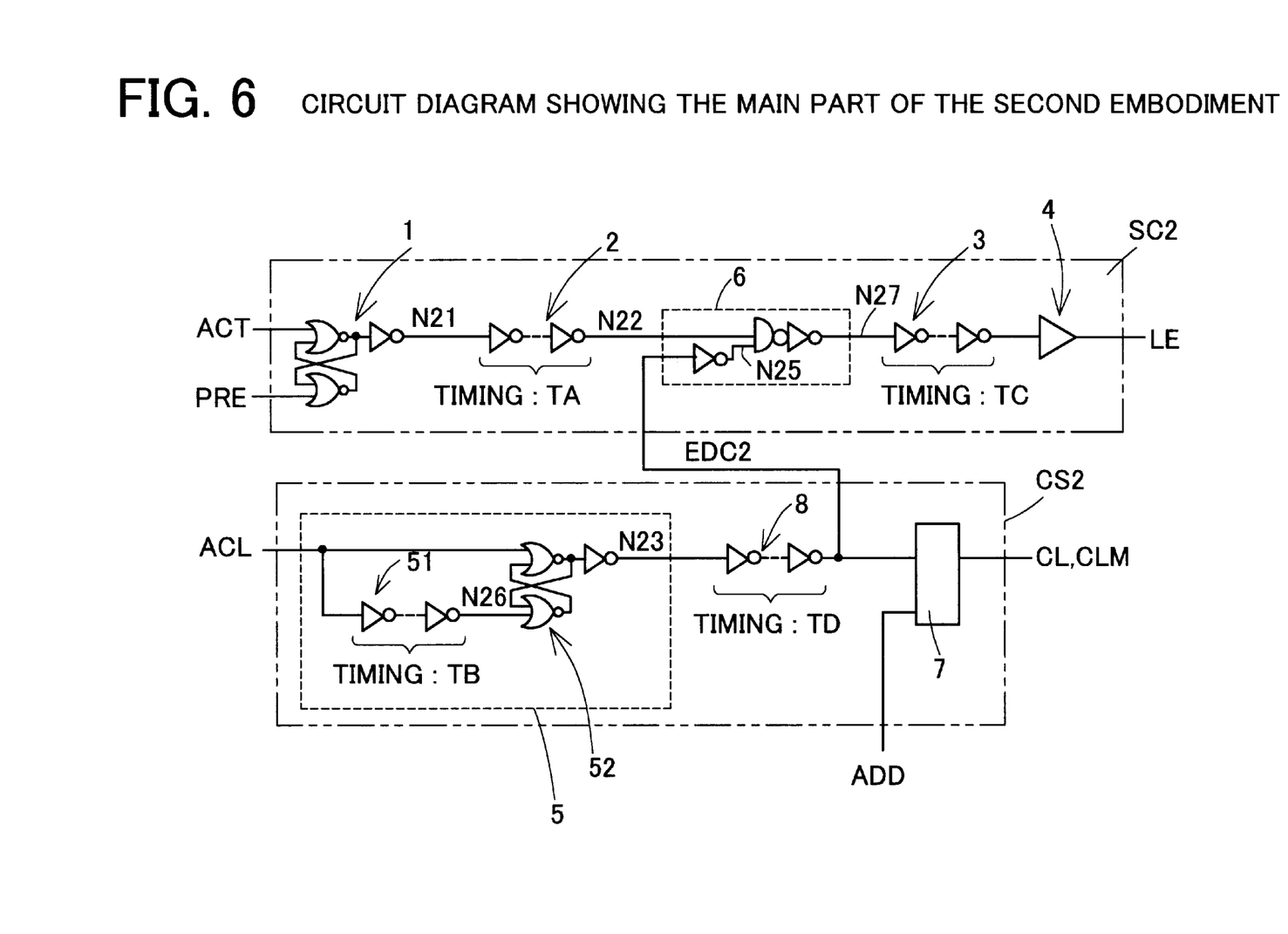
FIG. 6 is a circuit diagram showing the main part of the Second Embodiment.

The circuit diagram directed to the Second Embodiment shown in FIG. 6 is a typical internal circuit composed of the sense amplifier signal circuit SC2 and the column switch signal circuit CS2.

An active signal ACT and a precharge signal PRE both of which are outputted from a row control circuit RC in accordance with a command signal CMD are inputted onto the sense amplifier signal circuit SC2. Similar to the sense amplifier signal circuit SC1 directed to the First Embodiment, the signals ACT and PRE are inputted to a command latch circuit 1. The signals outputted thereto are then outputted from a terminal N21. The signals at the terminal N21 is outputted to a terminal N22 with a timing TA as delay time being added via a timing adjusting circuit 2. A signal coming from the terminal N22 and the control signal EDC2 from the column switch signal circuit CS2 are inputted to a logical circuit 6 to conduct AND processing and a processing result is outputted to a terminal N27. The terminal N27 outputs a sense amplifier activation signal LE via a timing adjusting circuit 3 and an output buffer circuit 4.

In the sense amplifier signal circuit SC2, an active signal ACT in positive logic is inputted to set the terminal N21 high level. Thereby, the sense amplifier SA is activated. An activation signal LE for the sense amplifier SA is outputted after a sum of timing TA+TC, beginning with an input of the active signal ACT, lapses. The timing TA is a timing that the timing adjusting circuit 2 adjusts output timing of the inputted signal. The timing TC is a timing that the timing adjusting circuit 3 adjusts the same thing as the above. In case a high level signal is inputted as control signal EDC2, the terminal N27 is fixed in low level and the activation signal LE for the sense amplifier SA is blocked (see FIG. 7). Non-conductivation timing of the sense amplifier SA is taken after a lapse of the timing TA+TC that begins with an input of the precharge signal PRE in positive logic.

The column switch signal circuit CS2 receives a control signal ACL as an input signal outputted from the column control circuit CC in accordance with a command signal CMD. Similar to the First Embodiment, the input signal ACL is inputted to a pulse output circuit 5. An output signal outputted from a terminal N23 in the pulse output circuit 5 is inputted to a timing adjusting circuit 8. The output terminal is the control signal EDC2. The control signal EDC2 is outputted as a switch signal CL or CLM to select one of the bit lines BL, /BL, BLM, and /BLM to be connected to respective memory cells Ta through Td inputted in the decode circuit 7 and decoded by an address signal. Furthermore, the control signal EDC2 is inputted to the sense amplifier signal circuit SC2.

When a control signal ACL as a positive pulse signal is inputted to the column switch signal circuit CS2, a resultant signal having pulse width of the timing TB is outputted to the terminal N23. In case pulse width of the control signal ACL is narrower than that of the timing TB, the pulse width of the pulse signal outputted toward the terminal N23 corresponds to that of the timing TB, and in case wider than that of the timing TB, the pulse width of the pulse signal outputted toward the terminal N23 corresponds to that of the control signal ACL. Receiving a delay of the timing TD at the timing adjusting circuit 8, the positive pulse signal to be outputted to the terminal N23 turns into a control signal EDC2 thereat.

Figure 7:
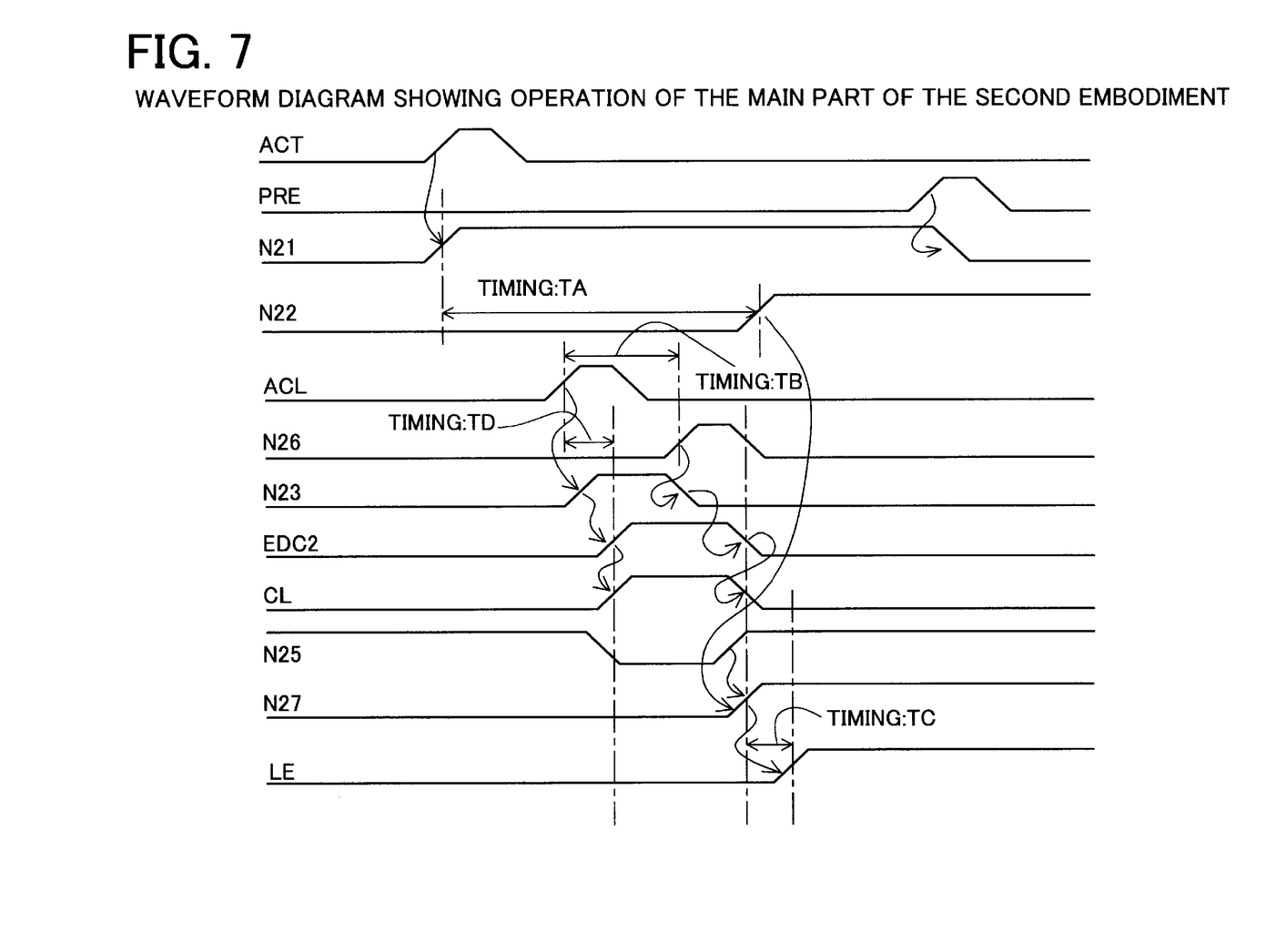
FIG. 7 is a waveform diagram showing operation of the main part of the Second Embodiment.

FIG. 7 shows an operational waveform diagram of the main part of the Second Embodiment composed of the sense amplifier signal circuit SC2 and the column switch signal circuit CS2. When a write signal is inputted as a command signal CMD, an active signal ACT transmitted from the row control circuit RC is outputted as a positive pulse signal inputted to the sense amplifier signal circuit SC2. The command latch circuit 1 latches the signal ACT to set the output terminal N21 high level. After timing TA passes, the signal sets the terminal N22 high level due to the timing adjusting circuit 2.

On the other hand, the command signal CMD is inputted to the column control circuit CC as well as the row control circuit RC simultaneously. Posterior to output of an active signal ACT, control signal ACL is outputted from the column control circuit CC as a positive pulse signal. The control signal ACL is inputted to the pulse output circuit 5 integrated in the column switch signal circuit CS2. Going into the pulse output circuit 5, the control signal ACL sets the command latch circuit 52 and is inputted to the timing adjusting circuit 51. As a result, a pulse signal with a delay time corresponding to timing TB is generated at the terminal N26. The delay pulse signal outputted from the terminal N26 resets the command latch circuit 52 and a positive pulse signal is outputted to the terminal N23. Pulse width of the pulse signal corresponds to the timing TB set at the timing adjusting circuit 51. The pulse signal outputted to the terminal N23 is outputted as a control signal EDC2 after lapse of the timing TD set at the timing adjusting circuit 8. Through the decoder circuit 7, switch signals CL and CLM are outputted as resultant signal. The pulse signals CL and CLM make the column switches TN1 through TN4 conductive while they are high level. Thereby, the data bus lines DB and /DB are connected to the bit lines BL, /BL, BLM, and /BLM and write data from the write amplifier WA are inputted to the bit lines BL, /BL, BLM, and /BLM.

The control signal EDC2 is inputted to the logical circuit 6 to output an inverse pulse signal to the terminal N25. Provided that the inverse pulse signal at the terminal N25 is set to start up within the timing TA (from input of an active signal ACT until output of a high level signal at the terminal N22), the signal outputted from the logical circuit 6 to the terminal N27 becomes high level when both a signal at the terminal N22 and a signal at the terminal N25 become high level. After the timing TC set by the timing adjusting circuit 3 lapses, the terminal N27 outputs a sense amplifier activating signal LE via the output buffer circuit 4. Generally, typical pulse outputs of switch signals CL, CLM are set with taking a time long enough to activate the sense amplifier SA. Accordingly, posterior to an inverse pulse signal at the terminal N25, a signal at the terminal N22 shifts to high level. That is, timing TC can surely be obtained within a time between output termination of switch signals CL, CLM and start up of a sense amplifier activating signal LE.

In case pulse output of the switch signals CL, and CLM becomes longer and lasts even after an inverse signal at the terminal N25 shifts to high level, high-level shift of the terminal N27 is determined by the inverse pulse signal at the terminal N25. In this case as well, timing TC can surely be obtained within a time between output termination of switch signals CL, CLM and start up of a sense amplifier activating signal LE.

Due to a control signal ACL following an active signal ACT, a pulse signal is outputted to the terminal N23. After lapse of the timing TD, the pulse signal turns into a control signal EDC2. If a pulse of the control signal EDC2 starts and ends within timing TA, an activation signal LE for the sense amplifier SA is outputted with fixed to the timing TA+TC beginning with input of an active signal ACT. Once the time of the control signal EDC2 as a pulse signal is optimized as readout time, write operation can be inserted within a period of readout operation.

Similar to the First Embodiment, optimum operation can be set by appropriately adjusting length of timing TA, TC, TD, and TB directed to the timing adjusting circuits 2, 3, 8, and 51, respectively.

According to the Second Embodiment, a time difference longer than the timing TC is surely obtained between non-conductivation operation of the column switches TN1 through TN4 and activation of the sense amplifier SA. Thereby, the sense amplifier SA can be made active after the column switches TN1 through TN4 are made nonconductive.

Furthermore, pulse width of the switch signals CL, CLM can be adjusted to the timing TB so that voltage to write data on the bit lines BL, /BL, BLM, and /BLM should be minimum voltage needed for amplification of the sense amplifier SA. As a result, amount of task such as data input operation done by the write amplifier WA for the bit lines BL, /BL, BLM, and /BLM can be limited to a minimum essential. Thereby, driving ability of the write amplifier WA can be lessened to a minimum essential, as well. Such aspects as the above contribute to development of higher circuit integration and lower power for semiconductor integrated circuit device.

Still further, output timing of the activation signal LE for the sense amplifier SA is fixed within the timing TA+TC which begins with input of the active signal ACT. Accordingly, once this timing is optimized as a readout time, writing operation can be inserted in readout operation.

Figure 8:
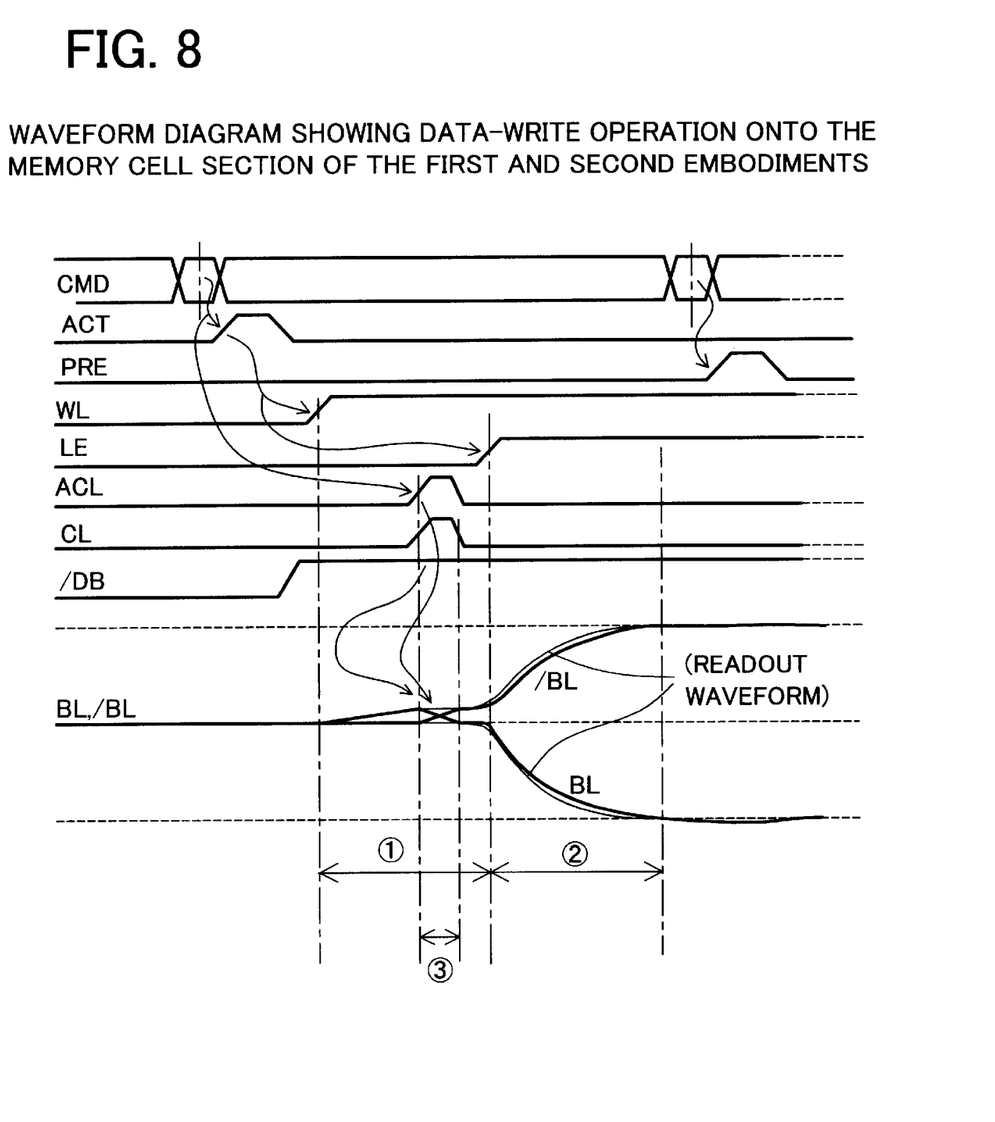
FIG. 8 is a waveform diagram showing data-write operation onto the memory cell section of the First and Second Embodiments.

FIG. 8 shows a data-write operation waveform with respect to the memory cell sections M1 and M2 directed to the First and Second Embodiments, respectively. The memory cells M1 and M2 include the sense amplifier signal circuits SC1 and SC2, and the column switch signal circuits CS1 and CS2, respectively. Receiving a command signal CMD, an active signal ACT is outputted from the row control circuit RC. In response to the active signal ACT, the word line WL starts up and then, the sense amplifier SA activates. Until the sense amplifier SA activates, a control signal ACL is outputted from the column control circuit CC to terminate an output pulse of a switch signal CL. When the word line WL starts up, all the memory cells Ta, Tb, Tc, and Td are connected to the bit lines BL, /BL, BLM, and /BLM, respectively, whereby, cell charges are redistributed to the bit lines BL, /BL, BLM, and /BLM (Period $\hat{1}$. During the Period $\hat{1}$, the column switches TN1, and TN2 toward the bit lines BL, /BL connected to the memory cell Tc subject to data-write is made conductive so as to write data to the memory cell Tc (Period $\hat{3}$ within Period $\hat{1}$). Voltage for data-write may be voltage level that the sense amplifier SA can amplify by itself during amplification period for the bit lines BL, /BL, BLM, and /BLM (Period $\hat{2}$) due to activation of the sense amplifier SA. Accordingly, voltage to write data to the bit lines BL, /BL during the Period $\hat{3}$ within the Period $\hat{1}$ may be voltage necessary to redistribute charges to the bit lines BL, /BL during data-readout. Although the output period of the switch signal CL is short, voltage for write may be subtle. Accordingly, driving ability of the write amplifier WA can be restricted.

Accordingly, after the column switches TN1 and TN2 are made nonconductive, the sense amplifier SA amplifies data inputted to the bit lines BL, /BL by the write amplifier WA through the column switches TN1, TN2 as a switch section in conductive state. The data are amplified up to a voltage value high enough to be written in the memory cell Tc. That is, the write amplifier WA can exercise write operation taking the following two steps: (1) amplify voltage up to a voltage value that the sense amplifier SA can amplify and input the amplified voltage to the bit lines BL, /BL; and (2) exercise sequential operation in accordance with normal readout operation that the sense amplifier SA amplifies voltage for the bit lines BL, /BL. Accordingly, a voltage value that the write amplifier WA should input is limited and its driving ability can be lessened to a minimum essential. As a result, circuit scale of the write amplifier WA can be made small, thereby to make an area for a write amplifier WA occupied on a chip small and to lower power consumption. The aspects such as above definitely contribute to development of higher circuit integration and lower power consumption. The minimum voltage value that the write amplifier WA should input to the bit lines BL, /BL is a voltage value for amplification sensitivity of the sense amplifier SA. Once the voltage value is set as a minimum essential voltage, driving ability of the write amplifier WA can be set to a minimum essential. When the write amplifier WA inputs voltage higher than the minimum essential, voltage to the bit lines BL, /BL sure can be amplified. Thereby, data sure can be written in the memory cell Tc.

Since voltage value with which the write amplifier WA writes data in the bit lines BL, /BL is restricted to voltage sensitivity for the bit lines BL, /BL, an amount of voltage transition at the bit lines BL, /BL due to the write operation is small. As a result, noise due to capacity coupling that takes place at the adjacent memory cells Ta, Tb, and Td or the bit lines BL, /BL becomes little and erroneous data inversion due to data write operation can be prevented.

Furthermore, the manner that the sense amplifier SA amplifies voltage for the bit lines BL, /BL after the column switch TN1, TN2 are made nonconductive is similar to a manner that the sense amplifier SA amplifies voltage for normal readout operation. Furthermore, a voltage value to be inputted to the bit lines BL, /BL during data-write operation can be restricted. Therefore, the write amplifier WA can perform data-write operation with minimum necessary driving ability. Accordingly, writing operation can be inserted in readout operation by using a write amplifier WA that occupies a small are in a limited circuit scale realizes low power consumption. That is, a write operation cycle can be realized within a cycle the same as a readout operation cycle.

The present invention is not confined to the foregoing the First and Second Embodiments, but various modifications and alterations are obviously possible within the scope of the substance of the invention.

For example, though operation state of the write amplifier WA is not mentioned in the embodiments, a write amplifier may stop operation after predetermined voltage is written into bit lines. Thereby, power consumption of a write amplifier can be further lessened.

According to the present invention, there is provided a semiconductor integrated circuit device capable of achieving low power consumption and high-speed operation during data-write operation, and stable operation with less occurrence of noises due to write operation. More specifically, data-write operation on memory cells is exercised after taking the following two steps: (1) input voltage that can be amplified on bit lines; and (2) amplify bit line voltage by blocking data input paths toward the bit lines.

What is claimed is:

1. A semiconductor integrated circuit device including memory cells and bit lines which are connected to the memory cells and exercise readout/write of data between the memory cells and the bit lines, wherein the device further includes:
   a write amplifier for inputting the data on the bit lines so as to write the data on the memory cells;
   a switching section for connecting the write amplifier and the bit lines; and
   a sense amplifier for amplifying voltage inputted on the bit lines;
   the sense amplifier being activated on condition that the write amplifier inputs the data on the bit lines to make the switching section nonconductive.

2. A semiconductor integrated circuit device according to claim 1, wherein the switching section is made nonconductive after the voltage inputted on the bit lines through the switching section in conductive state reaches a predetermined voltage value.

3. A semiconductor integrated circuit device according to claim 2, wherein the predetermined voltage value is a potential difference high enough for the sense amplifier to amplify voltage appropriately.

4. A semiconductor integrated circuit device according to claim 1 further including a sense amplifier activating circuit, wherein non-conductivation control of the switching section is exercised based on a non-conductivation command signal from the sense amplifier activating circuit.

5. A semiconductor integrated circuit device according to claim 4 further including a timing adjusting circuit arranged in a circuit path between the non-conductivation command signal and the sense amplifier activating circuit, wherein activation timing for the sense amplifier is a predetermined timing of delay against non-conductivation timing for the switching section.

6. A semiconductor integrated circuit device according to claim 1 further comprising a switching control circuit for controlling the switching section, wherein activation control of the sense amplifier is exercised based on an activation command signal from the switching control circuit.

7. A semiconductor integrated circuit device according to claim 6 further including a timing adjusting circuit arranged in a circuit path between the activation command signal and the sense amplifier activating circuit, wherein activation timing for the sense amplifier is a predetermined timing of delay against non-conductivation timing for the switching section.

8. A semiconductor integrated circuit device according to claim 1 further including a switching control circuit for controlling the switching section which outputs a pulse signal with a predetermined time width, wherein the pulse signal makes the switching section conductive.

9. A semiconductor integrated circuit device according to claim 1, wherein a command input executes selection of the memory cells, and discrimination of data-readout from the memory cells or data-write thereto.

10. A semiconductor integrated circuit device according to claim 9, wherein the memory cells have capacity elements and the data are recorded based on present/absent of charge storage for the capacity elements.

11. Data-write method of a semiconductor integrated circuit device including memory cells and bit lines which are connected to the memory cells and exercise read or write of data between the memory cells, the data-write method comprises:

data input process to input the data to the bit lines;

separation process to separate the bit lines from input route of the data; and amplification process to amplify voltage of the data on the bit lines separated from the input route after the separation process.

12. Data-write method according to claim 11, wherein the separation process is conducted after voltage of the data to be inputted to the bit lines in accordance with the data input process reaches a predetermined voltage value.

13. Data-write method according to claim 12, wherein the predetermined voltage value is a potential difference high enough for the sense amplifier to amplify voltage appropriately in the amplification process.

14. Data-write method according to claim 11 further including timing adjusting process to delay timing of a shift from the separation process to the amplification process by a predetermined length of timing.

* * * * *